United States Patent
Wang et al.

(10) Patent No.: US 6,509,137 B1
(45) Date of Patent: Jan. 21, 2003

(54) MULTILAYER PHOTORESIST PROCESS IN PHOTOLITHOGRAPHY

(75) Inventors: Li-Ming Wang, Taoyuan (TW); Kao-Tsair Tsai, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/578,105

(22) Filed: May 24, 2000

(30) Foreign Application Priority Data

Feb. 10, 2000 (TW) ....................................... 89102173 A

(51) Int. Cl.⁷ ................................................. G03C 5/00

(52) U.S. Cl. ...................... 430/312; 430/325; 430/326; 430/330

(58) Field of Search ................................ 430/312, 330, 430/325, 326

(56) References Cited

U.S. PATENT DOCUMENTS

| | | | | |
|---|---|---|---|---|
| 4,015,986 A | * | 4/1977 | Paal et al. ...................... | 96/36 |
| 4,592,132 A | * | 6/1986 | Lee et al. ...................... | 29/590 |
| 5,252,414 A | * | 10/1993 | Yamashita et al. ............ | 430/22 |
| 6,025,899 A | * | 2/2000 | Fukunaga et al. .......... | 349/115 |

* cited by examiner

*Primary Examiner*—Rosemary Ashton
(74) *Attorney, Agent, or Firm*—J. C. Patents

(57) ABSTRACT

A multilayer photoresist process in photolithography, which is applicable on a substrate having a composite photoresist layer with a desired thickness formed thereon. The present invention provides a process, comprising the following steps. A photoresist layer is formed on a substrate, and subsequently exposed through a photomask, followed by the developing process to pattern the photoresist. Then, the patterned photoresist layer is stabilized. This sequence is repeated untill at least another one layer is deposited and patterned on the substrate. Each photoresist layer has almost the same pattern with the underlying patterned photoresist layer. Many thin photoresist layers are accumulated to form a composite photoresist layer with a desired thickness.

11 Claims, 4 Drawing Sheets

MULTILAYER PHOTORESIST PROCESS IN PHOTOLITHOGRAPHY

CROSS-REFERENCE TO RELATED APPLICATION

This application claims the priority benefit of Taiwan application serial no. 89102173, filed Feb. 10, 2000.

BACKGROUND OF THE INVENTION

1. Field of Invention

The present invention relates to a photolithography technology. More particularly, the present invention related to a multilayer photoresist process in photolithography for increasing photolithography process window magnitude.

2. Description of Related Art

In the semiconductor photolithography, the exposure resolution and the depth of focus are two key parameters that determine photolithography quality. According to Rayleigh's theory, the exposure resolution and the depth of focus in a photolithography process can be expressed as follows:

$$\text{Resolution} = K_1 \times \lambda / NA$$

$$DOF = K_2 \times \lambda / NA^2$$

Where $\lambda$ is the wavelength of incident light, NA is the numerical aperture of the lens, and $K_1$ and $K_2$ are factors controlled by both the optical system and the photoresist, These parameter values depend on the photoresist material, the photoresist thickness, and the exposure method.

Generally, the thinner the photoresist layer is, the lower $K_1$ value, the higher $K_2$ value, and the higher exposure margin are. The $K_1$ value is reduced corresponding to the exposure resolution is increased. The $K_2$ value is increased corresponding to the depth of focus is increased. Therefore, the thinner the photoresist layer is, the better the pattern quality is, that is, the larger the lithography process window is. However, the over thin photoresist layer can not usually resist the plasma etching, therefore, the photoresist layer must have a certain thickness to serve as an etching mask.

To resolve the above problems, the bilayer process is used in photolithography process in the prior art. The bilayer process, which is the top layer and the bottom layer with different material are coated on a wafer in sequence. The top photoresist layer is patterned, and subsequently the bottom layer is dry-etched. The top patterned photoresist layer is in combination with the bottom layer to form a thick composite photoresist layer. However, the bilayer method includes overlapping two layers and subsequent patterning the top photoresist layer and dry etching the bottom layer. Therefore, the top photoresist material should be different from the bottom photoresist material in etching selectivity.

SUMMARY OF THE INVENTION

Based on the foregoing, the present invention provides a multilayer photoresist process in photolithography to solve the above problems of concurrently taking the photoresist thickness and the pattern quality into consideration. Many thin photoresist layers are accumulated to form a composite photoresist with a desired thickness.

The present invention further provides a bilayer photoresist process in photolithography to solve the problems of the bilayer photoresist process of the prior art.

According to a preferred embodiment of the present invention, the present invention provides a process, comprising the following steps. A photoresist layer is formed on a substrate, and subsequently exposed through a photomask, followed by the developing process to pattern the photoresist. Then, the first patterned photoresist layer is stabilized to avoid the transformation of constituents due to the influence with the subsequent exposing and developing steps of the overlying photoresist layers. This sequence is repeated untill at least another one layer is deposited and patterned on the substrate. Each photoresist layer has almost the same pattern with the underlying patterned photoresist layer. The photoresist layers are accumulated to form a composite photoresist layer with a desired thickness. Photoresists are of two types: positive, which on exposure to light become more soluble in a developer solution, and negative, which become less soluble, and any one photoresist layer in the composite photoresist layer can be positive or negative.

According to the present invention, each photoresist layer has almost the same pattern as the underlying patterned photoresist layer. If both the photoresist layer and the underlying photoresist layer are the same type photoresists such as positive or negative. The same photomask containing the desired pattern is applied to the same type photoresist. If the type of the top photoresist layer is different from the type of the underlying photoresist layer, such that one is positive (negative), and the other is negative (positive). While the two photoresist layers are exposed through the photomasks with patterns, the pattern in one photomask is complementary to that in another photomask.

Accordingly, the present invention provides a method to form a composite photoresist with a desired thickness. The composite photoresist layer is composed of many thin photoresist layers. Every thin photoresist layer is thinner than the composite photoresist layer. The thinner the photoresist layer is, the larger the lithography process window is. Therefore, the large lithography process window is obtained by accumulating many thin layers to a desired thickness rather than by forming a single photoresist layer with the same desired thickness.

In addition, the magnitude of the lithography process window depends on the monolayer thickness. In the present invention, a composite photoresist is composed of many thin photoresist layers to increase the total photoresist thickness. Meanwhile, the magnitude of the lithography process window is kept large.

Furthermore, in the present invention, the photoresist layer is stabilized before the subsequent light-exposure, and photoresist development steps for the overlying photoresist layer. In the case of bilayer photoresist, both the two photoresist layers can use the same material. Therefore, comparing with bilayer process of the prior art, the photoresist material is easily found in the present invention.

Accordingly, many thin photoresist layers are combined in a composite photoresist with a desired thickness to increase the magnitude of the lithography process window. In addition, the magnitude of the lithography process window depends on the monolayer thickness. Therefore, the present invention provides a method to increase the total photoresist thickness, and keep the lithography process window large. Furthermore, In the case of bilayer photoresist process, the photoresist layer is stabilized before subsequent light-exposure, and photoresist development steps for the overlying photoresist layer. Therefore, both the two photoresist layers can use the same material, and therefore the photoresist material and light-exposure conditions are easily found.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

According to a preferred embodiment of the present invention, the bilayer photoresist process is put forward as an example to illustrate the change in the patterning steps for the different type of photoresist existing in the bilayer photoresist. The three examples is provided to illustrate the change in the patterning steps for the different bilayer photoresist system.

EXAMPLE 1

FIGS. 1A to 4D are schematic, cross-sectional views showing the change in the patterning steps for the different bilayer photoresist system according to one preferred embodiment of this invention.

Figure 1A:
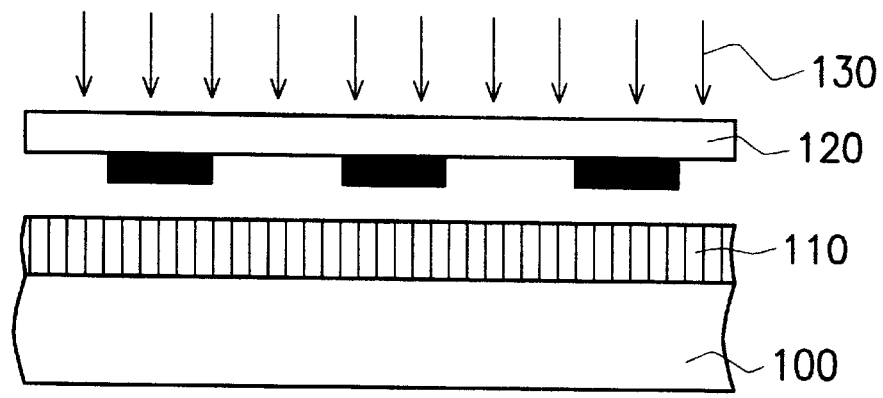
FIGS. 1A to 1D are schematic, cross-sectional views showing the bilayer photoresist process with two positive photoresists according to the first preferred embodiment of this invention, wherein the second positive photoresist layer is conformally formed on the first positive photoresist layer and the substrate.
Figure 1B:
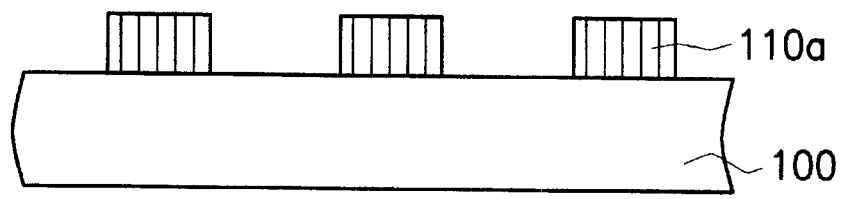

Referring to FIGS. 1A and 1B, a substrate 100 is provided with the first positive photoresist layer 110 formed thereon. The first positive photoresist layer 110 is subsequently exposed through a photomask 120 by a light source 130. Subsequent to the development step, the first patterned positive photoresist layer 110a is resulted. Then, the first patterned positive photoresist layer 110a is stabilized by, for example, baking to prevent the influence of subsequent light exposure, photoresist development steps for the second positive photoresist layer 140.

Figure 1C:
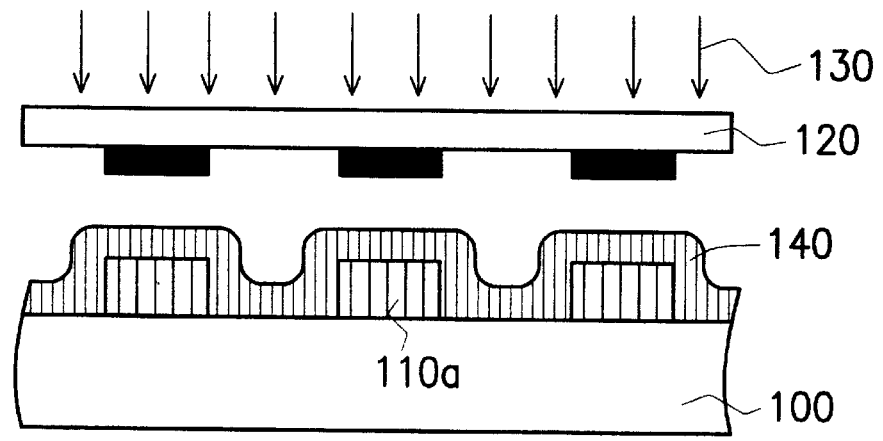
Figure 1D:
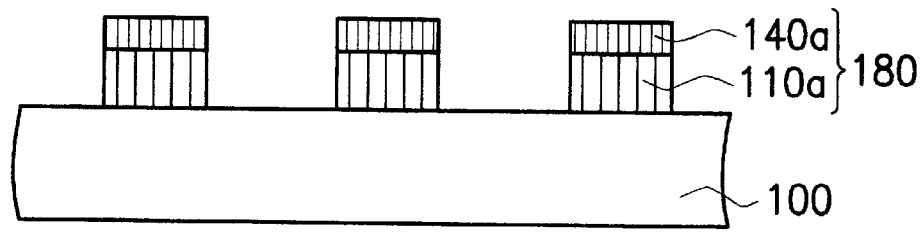

Referring to FIGS. 1C and 1D, the second thin positive photoresist 140 is conformally formed over the first positive photoresist 110a and the substrate 100. The conformal forming step includes thinning down the second positive photoresist layer. The second positive photoresist layer 140 is subsequently exposed through a photomask 120 by a light source 130. Subsequent to the development step, a thick patterned photoresist layer 180 is resulted, and the patterned photoresist 180 thickness is the sum of the first positive photoresist 110a thickness and the second positive photoresist 140a thickness.

In the present example, the second positive photoresist 140 conformally formed over the first positive photoresist 110a and the substrate 100 is a necessary condition to enlarge the magnitude of the lithography process window due to the thin exposed portion of the second positive photoresist 140 (as shown in FIG. 1C).

EXAMPLE 2

FIGS. 2A to 2D and FIGS. 3A to 3D, are schematic, cross-sectional views showing the bilayer photoresist processes with two negative photoresists. The difference for the two processes is in forming the second negative photoresist layer. In the first case, the second negative photoresist layer is conformally formed, and in the second case, the second negative photoresist layer is planarized formed.

Figure 2A:
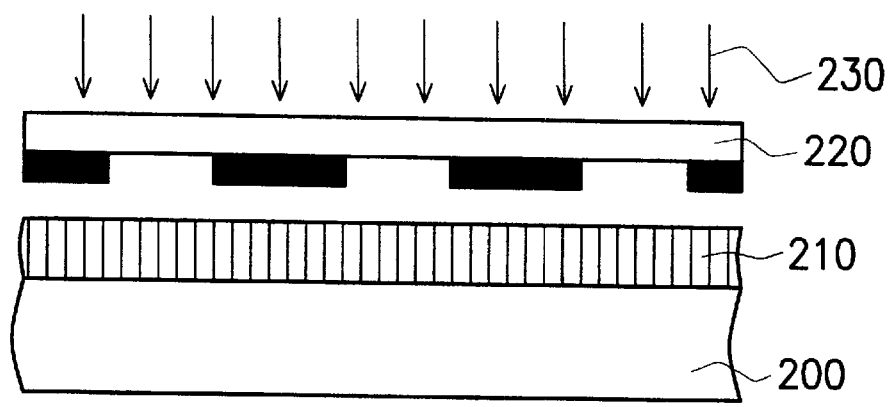
FIGS. 2A to 2D are schematic, cross-sectional views showing the bilayer photoresist process with two negative photoresists according to the second preferred embodiment of this invention, wherein the second negative photoresist layer is conformally formed on the first negative photoresist layer and the substrate.
Figure 2B:
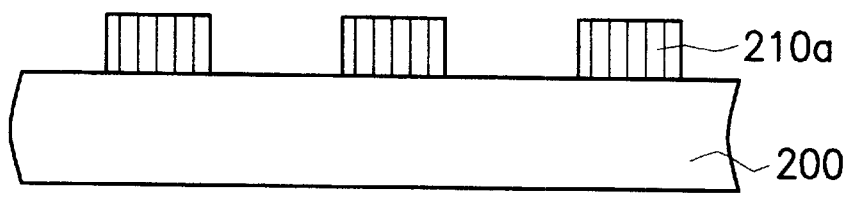

Referring to FIGS. 2A and 2B, a substrate 200 is provided with the first negative photoresist layer 210 formed thereon. The first negative photoresist layer 210 is subsequently exposed through a photomask 220 by a light source 230. Subsequent to the development step, the first patterned negative photoresist layer 210a is resulted. Then, the first negative photoresist layer 210a is stabilized by, for example, baking to prevent the influence of subsequent light exposure, photoresist development steps for the second negative photoresist layer 240.

Figure 2C:
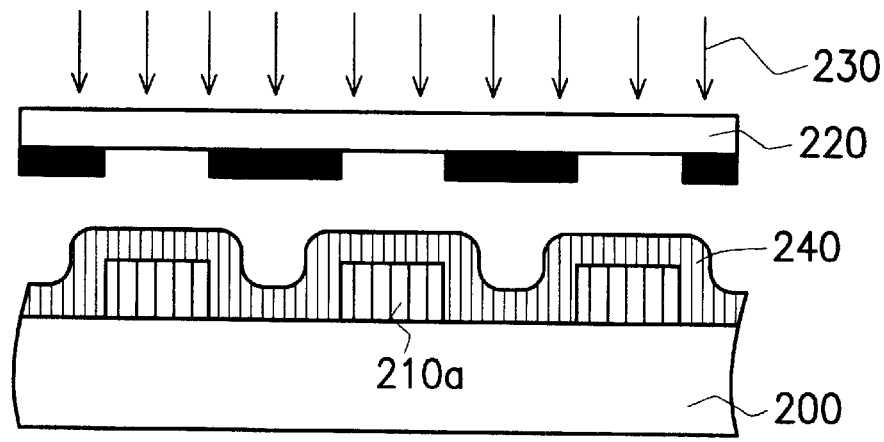
Figure 2D:
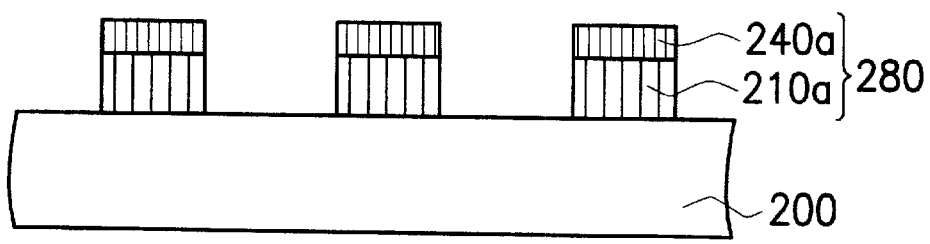

Referring to FIGS. 2C and 2D, the second thin negative photoresist 240 is conformally formed over the first negative photoresist 210a and the substrate 200. The second negative photoresist layer 240 is subsequently exposed through a photomask 220 by a light source 230. Subsequent to the development step, a thick patterned photoresist layer 280 is resulted, and the patterned photoresist 280 thickness is the sum of the first positive photoresist 210a thickness and the second positive photoresist 240a thickness.

Figure 3A:
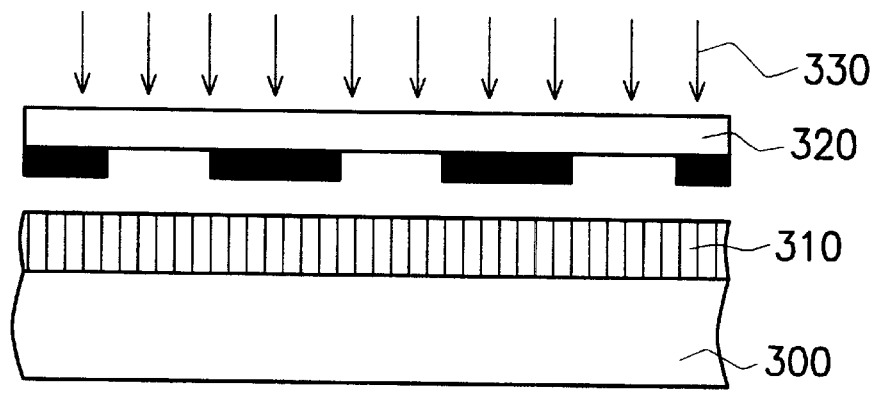
FIGS. 3A to 3D are schematic, cross-sectional views showing the bilayer photoresist process with two negative photoresists according to the third preferred embodiment of this invention, wherein the planarized second negative photoresist layer is formed on the first negative photoresist layer.
Figure 3B:
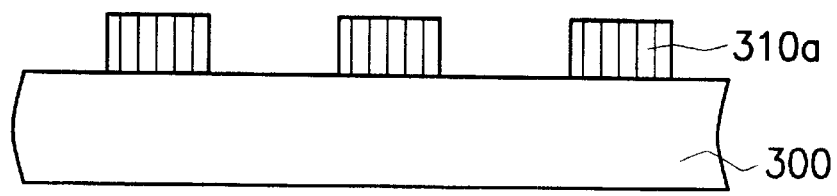

Referring to FIGS. 3A and 3B, a substrate 300 is provided with the first negative photoresist layer 310 formed thereon. The first negative photoresist layer 310 is subsequently exposed through a photomask 320 by a light source 330. Subsequent to the development step, the patterned first negative photoresist layer 310a is resulted. Then, the first negative photoresist layer 310a is stabilized by, for example, baking to prevent the influence of subsequent light exposure, photoresist development steps for the second negative photoresist layer 340.

Figure 3C:
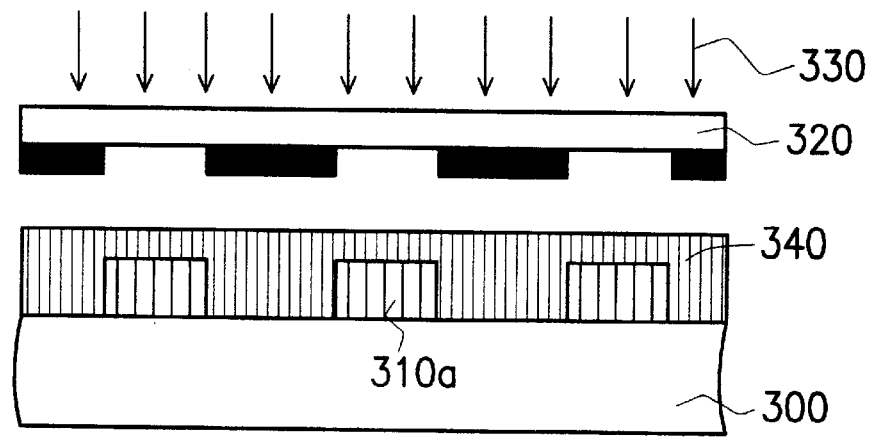
Figure 3D:
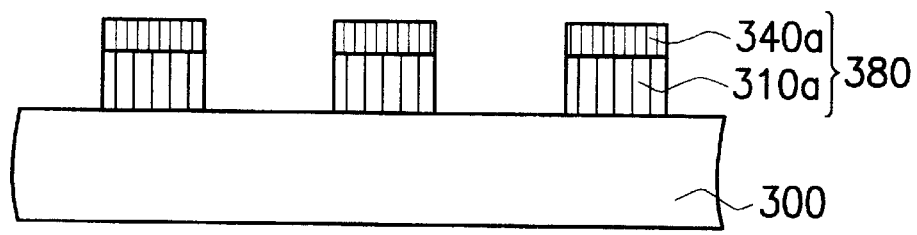

Referring to FIGS. 3C and 3D, the planarized second negative photoresist layer 340 is formed over the first negative photoresist 310a and the substrate 300. The second negative photoresist layer 340 is subsequently exposed through a photomask 320 by a light source 330. Subsequent to the development step, a thick patterned photoresist layer 380 is resulted, and the patterned photoresist 380 thickness is the sum of the first positive photoresist 310a thickness and the second positive photoresist 340a thickness.

In the above two cases, only the portion of the second negative photoresist layer formed on the top of the patterned first negative photoresist is exposed to light. Therefore, whether the second negative photoresist layer is formed conformally or not, the lithography process window is large due to the same thin thickness for the exposed portion of the second negative photoresist in both cases.

EXAMPLE 3

FIGS. 4A to 4D, are schematic, cross-sectional views showing the bilayer photoresist processes with one positive photoresist layer and one negative photoresist layer according to the preferred embodiment of the present invention.

Figure 4A:
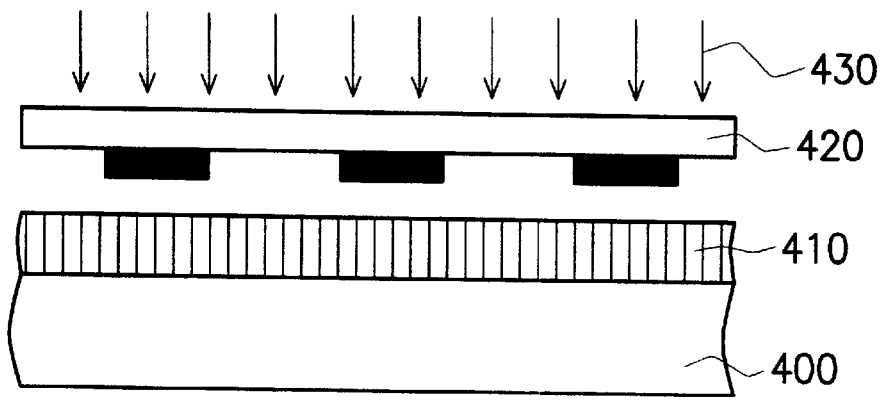
FIGS. 4A to 4D are schematic, cross-sectional views showing the bilayer photoresist process with one positive photoresist and one negative photoresist according to the fourth preferred embodiment of this invention, wherein the second photoresist layer is negative with a planarized surface formed on the first positive photoresist layer.
Figure 4B:
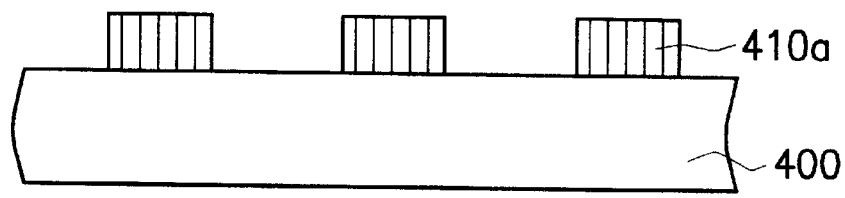

Referring to FIGS. 4A and 4B, a substrate 400 is provided with the positive photoresist layer 410 formed thereon. The positive photoresist layer 410 is subsequently exposed through a photomask 420 by a light source 430. Subsequent to the development step, the patterned positive photoresist layer 410a is resulted. Then, the positive photoresist layer 410a is stabilized by, for example, baking to prevent the influence of subsequent light exposure, photoresist development steps for the negative photoresist layer 440.

Figure 4C:
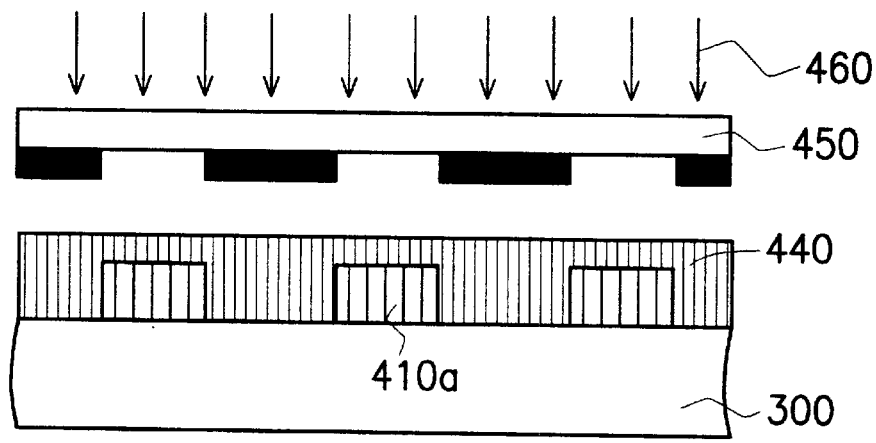
Figure 4D:
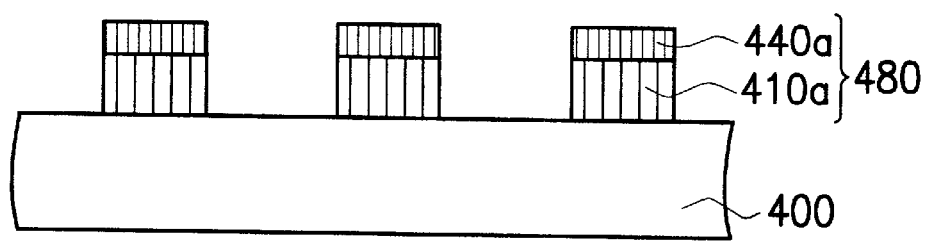

Referring to FIGS. 4C and 4D, the planarized negative photoresist layer 440 is formed on the positive photoresist 410a and the substrate 400. The negative photoresist layer 440 is subsequently exposed through a photomask 450 by a light source 460. Subsequent to the development step, a thick patterned photoresist layer 480 is resulted. The pattern in the photomask 450 and the pattern in the photomask 420 are complementary to each other, and then the pattern in the positive photoresist layer is the same as the pattern in the negative photoresist layer.

In addition, analogy to the examples 1 to 3, if the upper photoresist layer is positive, and the lower photoresist is negative. The upper positive photoresist layer is conformally formed on the lower negative photoresist layer, followed by the developing step. The pattern in the photomask applied on the positive photoresist layer and the pattern in the photomask applied on the negative photoresist layer are complementary to each other, and then the pattern in the positive photoresist layer is the same as the pattern in the negative photoresist layer.

Accordingly, the present invention provides a method to form a composite photoresist layer with a desired thickness. The composite photoresist layer is composed of two thin photoresist layers. The lithography process window is larger for every thin photoresist layer in the composite photoresist layer than that for a single composite photoresist layer with a desired thickness. Generally speaking, the present invention provide a process to form a composite photoresist layer, and the lithography process window is larger for many thin photoresist layers than that for a single thick photoresist layer with a desired thickness.

In addition, the magnitude of the lithography process window depends on the monolayer thickness. According to the preferred embodiment of the present invention, a bilayer photoresist is composed of two thin photoresist layers to increase the total photoresist thickness. Meanwhile, the lithography process window is kept large.

According to the preferred embodiment of the present invention, in the case of bilayer photoresist, the first photoresist layer is stabilized before subsequent light-exposure, and photoresist development steps for the second photoresist layer. Therefore, both the two photoresist layers can use the same material, and the photoresist material and light-exposure conditions are easily found in the present invention comparing with that in the prior art.

After the second photoresist layer is formed on the substrate, more photoresist layers can be accumulated on the second photoresist layer to increase the total thickness of a composite photoresist to increase the plasma etch resistance for the subsequent etching process. If the type of the overlying second photoesist layer is different from the type of the first photoresist layer, and then the pattern in the first photomask is complementary to the pattern in the second photorsist layer. In addition, if the upper layer is a positive photoresist layer, the positive photoresist layer is confor- mally formed on the lower layer to thin down the thickness of the exposed portion of the positive photoresist to obtain the large lithography process window.

According to the preferred embodiment of the present invention, two thin photoresist layers are combined in a composite photoresist with a desired thickness to enlarge the magnitude of the lithography process window, and the magnitude of the lithography process window depends on the monolayer thickness. The present invention provides a process to increase the total photoresist thickness. Meanwhile, the magnitude of the lithography process window is kept large. Furthermore, the first forming photoresist layer is stabilized before subsequent light-exposure, and photoresist development steps for the second forming photoresist layer. Therefore, both the two photoresist layers can use the same material, and the photoresist material and light-exposure conditions are easily found.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multilayer photoresist process in photolithography, which is applicable to a substrate having a composite photoresist layer with a desired thickness formed thereon, comprising the steps of:

forming a first photoresist layer on a substrate;

exposing the first photoresist layer, followed by developing step to form a first pattern;

stabilizing the patterned first photoresist layer; and forming a second photoresist layer on the stabilized patterned first photoresist layer;

exposing, developing, and stabilizing the second photoresist layer as above to form said first pattern;

repeating the sequence with each subsequent photoresist layer until a composite photoresist layer with a desired thickness having said first pattern is formed.

2. The method of claim 1, wherein the type of the first, second and subsequent photoresist layers is positive or negative.

3. The method of claim 1, wherein the second photoresist layer is a positive photoresist layer and the first photoresist layeris a negative photoresist layer.

4. The method of claim 1, wherein when the type of the second photoresist layer is the same as the type of the underlying first photoresist layer, a same photomask pattern is applied on both the first and the second photoresist layers.

5. The method of claim 1, wherein when the type of the second photoresist layer is different from the type of the first photoresist layer, the patterns in photomasks used for exposing said first and second photoresist layers are complementary to each other.

6. The method of claim 1, wherein the step of stabilizing the first photoresist layer includes baking.

7. A bilayer photoresist process in photolithography, comprising the steps of:

providing a substrate;

forming a first photoresist layer on the substrate;

exposing the first photoresist layer through a first photomask, followed by a first developing step to pattern the first photoresist layer;

stabilizing the patterned first photoresist layer;

forming a second photoresist layer on the patterned first photoresist layer;

exposing the second photoresist layer, followed by a second developing step to form said first pattern on the second photoresist layer, wherein said first photomask is used to expose said second photoresist layer when said first and second photoresist layers are of same type, and a second photomask is used, which photomask has a pattern is complementary to the pattern of said first photomask when said first and second photoresist layers are of different type; and stabilizing the second photoresist layer.

8. The method of claim 7, wherein the type of the first photoresist layer and the second photoresist layer are positive or negative.

9. The method of claim 7, wherein the second photoresist layer is conformally formed on the first photoresist layer.

10. The method of claim 7, wherein the type of the second photoresist layer is positive and the type of the first photoresist layer is negative.

11. The method of claim 7, wherein the type of the second photoresist layer is negative and the type of the first photoresist layer is positive.

* * * * *